United States Patent [19]
Hidber et al.

[11] Patent Number: 6,060,121
[45] Date of Patent: May 9, 2000

[54] MICROCONTACT PRINTING OF CATALYTIC COLLOIDS

[75] Inventors: Pirmin Hidber, Basel, Switzerland; Wolfgang Helbig, Munster, Germany; Enoch Kim, Boston; George M. Whitesides, Newton, both of Mass.

[73] Assignee: President and Fellows of Harvard College, Cambridge, Mass.

[21] Appl. No.: 08/616,692

[22] Filed: Mar. 15, 1996

[51] Int. Cl.$^7$ ............................................ B05D 5/00
[52] U.S. Cl. ................. 427/261; 427/283; 427/304; 427/305; 427/306; 427/404; 427/419.1
[58] Field of Search .................. 427/304–306, 427/283, 261, 404

[56] References Cited

U.S. PATENT DOCUMENTS

| | | | |
|---|---|---|---|
| 3,873,359 | 3/1975 | Lando . | |
| 3,873,360 | 3/1975 | Lando . | |
| 3,900,614 | 8/1975 | Lando | 427/258 |
| 4,073,981 | 2/1978 | Baron | 427/259 |
| 4,098,922 | 7/1978 | Dinella et al. | 427/54 |
| 4,100,037 | 7/1978 | Baron et al. | 204/15 |
| 4,192,764 | 3/1980 | Madsen | 430/455 |
| 4,322,457 | 3/1982 | Baron et al. | 427/259 |
| 4,472,458 | 9/1984 | Sirinvan et al. | 427/92 |
| 4,508,755 | 4/1985 | Reintjes et al. | 427/58 |
| 4,555,414 | 11/1985 | Hoover et al. | 427/43.1 |
| 4,690,715 | 9/1987 | Allara et al. | 148/6.15 R |
| 4,728,591 | 3/1988 | Clark et al. | 430/5 |
| 4,802,951 | 2/1989 | Clark et al. | 156/630 |
| 5,009,965 | 4/1991 | Feldstein | 427/304 |
| 5,079,600 | 1/1992 | Schnur et al. | 357/4 |
| 5,087,510 | 2/1992 | Tokas et al. | 428/209 |
| 5,512,131 | 4/1996 | Kumar et al. | 156/655.1 |

FOREIGN PATENT DOCUMENTS

| | | |
|---|---|---|
| 0 672 765 A1 | 9/1995 | European Pat. Off. . |
| WO 97/07429 | 2/1997 | WIPO . |

OTHER PUBLICATIONS

E. Kim et al., "Combining Patterned Self–Assembled Monolayers of Alkanethiolates on Gold with Anisotropic Etching of Silicon to Generate Controlled Surface Morphologies", J. Electrochem. Soc., vol. 142, No. 2, Feb. 1995.

T.P. Moffat et al., "Patterned Metal Electrodeposition Using an Alkanethiolate Mask", J. Electrochem. Soc., vol. 142, No. 11, Nov. 1995.

J.K. Schoer et al., "Scanning Probe Lithography", Langmuir, vol. 10, No. 3, pp. 615–618, 1994. (Abstract) (No mo).

E.A. Dobisz et al., "Self–Assembled Monolayer Films for Nanofabrication", Mat. Res. Soc. Symp. Proc., vol. 380, 1995. (No mo).

G.D. Wolf et al., "Neues Verfahren zur ganzflächigen und partiellen Metallisierung von Kunststoffen", *Galvanotechnik*, vol. 84, No. 7., pp. 2218–2226, 1993.

James W. Wilbur, Amit Kumar, Enoch Kim, and George M. Whitesides, "Microfabrication by Microcontact Printing of Self–Assembled Monolayers", Adv. Mater. 6, No. 7/8 (1994), pp. 600–604, (No mo.).

Amit Kumar, Hans A. Biebuyck, and George M. Whitesides, "Patterning Self–Assembled Monolayers: Applications in Material Science", Langmuir, 10, (1994), pp. 1498–1511. (No mo.).

Younan Xia, Milan Mrksich, Enoch Kim, and George M. Whitesides, "Microcontact Printing of Octadecyl–siloxane on the Surface of Silicon Dioxide and its Application in Microfabrication", J. Am. Chem. Soc., vol. 117, No. 37 (1995), pp. 9576–9577. (No mo.).

J.F. Dijksman, "Analysis of the injection–moulding process", Philips tech. Rev. 44, No. 7, pp. 212–217. Mar. 1989.

John E. Shaw, "Capillary fill encapsulation of ISFETs", Sensors and Actuators A, 37–38 (1993), pp. 74–76.

Jeffrey W. Jacobs and Stephen P.A. Fodor, "Combinatorial chemistry—applications of light–directed chemical synthesis", Tibtech, vol. 12, pp. 19–26. Jan. 1994.

Steven J. Sundberg et al., "Spatially–Addressable Immobilization of Macromolecules on Solid Supports", J. Am. Chem. Soc., vol. 117 (1995), pp. 12050–12057. (No mo.).

Christopher B. Gorman, Hans A. Biebuyck, and George M. Whitesides, "Fabrication of Patterned, Electrically Conducting Polypyrrole Using a Self–Assembled Monolayer: A Route to All–Organic Circuits", Chem. Mater. 7, (1995), pp. 526–629. (No. mo.).

Enoch Kim, Younan Xia, and George M. Whitesides, "Polymer microstructures formed by moulding in in capillaries", Nature, vol. 376, pp. 581–584. Aug. 1995.

David John Pritchard, Hywel Morgan, and Jonathan Mark Cooper, "Micron–Scale Patterning of Biological Molecules", Angew. Chem. Int. Ed. Engl. 34, No. 1 (1995), pp. 91–93. (No mo.).

Stephen J. Potochnik, Pehr E. Pehrsson, David S. Y. Hsu, and Jeffrey M. Calvert, "Selective Copper Chemical Vapor Deposition Using Pd–Activated Organosilane Films", Langmuir, vol. 11, No. 6, (1995), pp. 1841–1845. (No mo.).

Walter J. Dressick and Jeffrey M. Calvert, "Patterning of Self–Assembled Films Using Lithographic Exposure Tools", Jpn. J. Appl. Phys., vol. 32, pp. 5829–5839. Dec. 1993.

(List continued on next page.)

*Primary Examiner*—Janyce Bell
*Attorney, Agent, or Firm*—Wolf, Greenfield & Sacks, P.C.

[57] ABSTRACT

A method of transferring a chemical activating agent from an applicator to a substrate surface involves providing an applicator having a raised application surface, applying a chemical activating agent to the application surface, contacting the substrate surface with the application surface, and removing the applicator. The chemical activating agent is transferred in a form in which it is capable of effecting a chemical reaction, such as catalysis, at the surface. Thus, following transfer of the chemical activating agent to the surface in a pattern, a metal can be plated at the substrate surface in the pattern. The applicator can be an elastomeric stamp having a raised portion defining a stamping surface.

68 Claims, 7 Drawing Sheets

OTHER PUBLICATIONS

Genady S. Lazarov, Nikolal D. Kenkov, Orlin D. Veley and Peter A. Kralchevsky, and Kuniaki Nagayama, "Formation of Two–dimensional Structures from Colloidal Particles on Fluorinated Oil Substrate", J. Chem. Soc. Faraday Trans. 90 (14), (1994), pp. 2077–2083, (No mo).

Kuniaki Nagayami, "Fabrication of Two–Dimensional Colloidal Arrays", Phase Transitions, vol. 45, (1993) pp. 185–203 (No mo.).

Patrick Hover, Nobuyoshi Baba, and Hideki Masuda, "Small quantum–sized CdS particles assembled to form a regularly nanostructured porous film", Appl. Phys. Lett. 66 (20), pp. 2700–2702. May 1995.

Helmut Bönnemann, Rainier Brinkmann and Peter Neiteler, "Preparation and Catalytic Properties of NR+4–Stabilized Palladium Colloids", Applied Organometallic Chemistry, vol. 8, (1994), pp. 361–378. (No mo.).

Manfred T. Reetz and Wolfgang Helbig, "Size–Selective Synthesis of Nanostructured Transition Metal Clusters", J. Am. Chem. Soc. 116 (1994), pp. 7401–7402. (No mo.).

Manfred T. Reetz, Wolfgang Helbig, Stefan A. Quaiser, Ulrich Stimming, Norbert Breuer, and Roland Vogel, "Visualization of Surfactants on Nanostructured Palladium Clusters by a Combination of STM and High–Resolution TEM", Science, vol. 267 (1995), pp. 367–369. No. Mo.

Fiona C. Meldrum, Nicholas A. Kotov, and Janos H. Fendler, "Formation of Thin Films of Platinum, Palladium, and Mixed Platinum: Palladium Nanocrystallites by the Langmuir Monolayer Technique", Chem. Mater. 7, (1995), pp. 1112–1116. (No mo.).

Terrence G. Vargo, Joseph A. Gardella Jr., Jeffrey M. Calvert, and Mu–San Chen, "Adhesive Electroless Metallization of Fluoropolymeric Substrates", Science, vol. 262, pp. 1711–1712. Dec. 1993.

Jeffrey M. Calvert, Mu–San Chen, Charles S. Dulcey, Jackque H. Georger, Martin C. Peckerar, Joel M. Schnur, and Paul E. Schoen, "Deep ultraviolet patterning of monolayer films for high resolution lythography", J. Vac. Sci. Technol. B9 (6), pp. 34473450. Dec. 1991.

Jian Li, Robert Blewer, and J.W. Mayer, "Copper–Based Metallization for ULSI Applications", MRS Bulletin, pp. 18–21. Jun. 1993.

James S.H. Cho, Ho–Kyu Kang, S. Simon Wong, and Yosi Shacham–Diamand, "Electroless Cu for VLSI", MRS Bulletin, pp. 31–37. Jun. 1993.

Andre M.T. van der Putten, Jan–Willem G. De Bakker, and Lambertus G.J. Fokkink, "Electrochemistry of Colloidal Palladium", J. Electrochem. Soc., vol. 139, No. 12, pp. 3475–3480. Dec. 1992.

Chiu H. Ting and M. Paunovic, Selective Electroless Metal Deposition of Integrated Circuit Fabrication, J. Electrochem. Socl., vol. 136, No. 2, pp. 456–462. Feb. 1989.

Robert L. Jackson, "PD+2/Poly(acrylic acid) Thin Films as Catalysts for Electroless Copper Deposition: Mechanism of Catalyst Formation", J. Electrochem. Soc., vol. 137, No. 1, pp. 95–101. Jan. 1990.

Andre M. T. van der Putten and Jan–Willem G. de Bakker, "Anisotropic Deposition of Electroless Nickel", J. Electrochem. Soc., vol. 140, No. 8, pp. 2229–2235. Aug. 1993.

Andre M. T. van der Putten, "Controlled Mechanical Adhesion of Electroless Cu Patterns", J. Electrochem. Soc., vol. 140, No. 8, pp. 2376–2378. Aug. 1993.

Robert L. Jackson, "Initiation of Electroless Copper Plating Using Pd+2/Poly(acrylic acid) Films", J. Electrochem. Soc., (1988), pp. 3172–3173. (No mo.).

Cecelia Y. Mak, "Electroless Copper Deposition on Metals and Metal Silicides", MRS Bulletin, pp. 55–62. Aug. 1994.

Walter J. Dressick, Charles S. Dulcey, Jacque H. Georger, Jr., and Jeffrey M. Calvert, "Photopatterning and Selective Electroless Metallizatoin of Surface–Attached Ligands", J. Chem. Mater. 5, (1993), pp. 148–150.

S. Nakahara and Y. Okinaka, "Microstructure and Mechanical Properties of Electroless Copper Deposits", Annu. Rev. Mater. Sci. 21, (1991), pp. 93–129. (No mo).

Noo Li Jeon and Ralph G. Nuzzo, Younan Xia, Milan Mrksich, and George M. Whitesides, "Patterned Self–Assembled Monolayers Formed by Microcontact Printing Direct Selective Metalization by Chemical Vapor Deposition on Planar and Nonplanar Substrates", Langmuir, 11, (1995), pp. 3024–3026. (No mo.).

Valery M. Dubin, "Electroless Ni—P Deposition on Silicon with Pd Activation", J. Electrochem. Soc., vol. 139, No. 5, May, 1992, pp. 1289–1294.

MICROCONTACT PRINTING OF CATALYTIC COLLOIDS

STATEMENT AS TO POTENTIAL RIGHTS UNDER FEDERALLY SPONSORED RESEARCH AND DEVELOPMENT

Research leading to the invention disclosed and claimed herein was supported in part by the Office of Naval Research, ONR Contract No. N00014-86K-0756. The U.S. Government may have certain rights to the invention.

FIELD OF THE INVENTION

The present invention relates generally to the application of a chemical activating agent such as a catalyst to a surface, and more particularly to the patterning of a metal on a surface via application to the surface of a colloid that catalyzes metal deposition in the pattern, followed by deposition of the metal.

BACKGROUND OF THE INVENTION

It is often a goal, in areas such as electronics, organic and inorganic chemical catalysis, and electrochemistry, to rapidly and economically apply to surfaces chemical activating agents. Particularly in the fabrication of microelectronic devices, optics, integrated circuits, and the like, it is desirable to deposit patterned metal pathways on a surface in an economically and environmentally sound manner.

A variety of processes are available for forming electrically-conductive pathways on substrates. As an example of a photolithographic process, a metal film can be laminated to a non-conductive substrate, a photoresist applied to the metal laminate layer and exposed to light through a mask in a pattern corresponding to the desired pathway, the non-irradiated portion of the photoresist removed, newly-exposed portions of the metal laminate layer etched, and the photoresist removed to expose a metal pathway corresponding to the pattern of irradiation applied to the photoresist. Other techniques for applying metal pathways to surfaces include the well-known "silk screening" technique, in which a paste containing finely-divided metal particles in a carrier is applied, for example, via a screen including a pattern, to a substrate in a pattern corresponding to the screen pattern. The paste is fired and a conductive metal pathway having a pattern corresponding to the screen pattern results.

Electroless deposition is a process widely used for the application of metals such as copper, gold, silver, nickel, rhodium, cobalt, and others to substrates. Electroless deposition occurs by an autocatalytic redox process, in which the cation of the metal to be deposited is reduced by a soluble reductant at the surface of a catalyst used to initiate the deposition, and subsequently at the surface of the metal feature being formed. This redox process generally takes place only on catalytic surfaces, that is, surfaces that inherently are catalytic to the redox process or surfaces that first are activated with a catalyst. Several methods are known for patterning a catalyst on a non-catalytic substrate. That is, selectively activating a substrate in a pattern corresponding to an ultimate pattern of metal deposition. U.S. Pat. No. 4,472,428 (Sirinyan et al.) describes a process for the production of metalized semiconductors using a process involving application of catalyst across a surface, applying a polymeric material, through a mask having a pattern, to the surface, plating a metal on the surface, and dissolving the template to produce a patterned metal layer.

U.S. Pat. No. 4,322,457 (Baron et al.) describes patterned metal deposition that involves applying a surfactant to a substrate in a pattern (via, for example, conventional printing techniques) applying a precursor of a catalytic agent to the surface (e.g. $Pd^{2+}$), allowing the precursor to be "buried" such that the surfactant covers the precursor in the originally-applied pattern, rinsing the surface, exposing the surface to an agent to convert the precursor to a catalyst (e.g. Pd), and plating a metal at the surface in a pattern complementary to the original pattern.

U.S. Pat. No. 4,192,762 (Madsen) describes patterned metal deposition that involves coating a surface with a reducible salt of a non-noble metal and a radiation-sensitive reducing agent, irradiating the surface in a pattern to reduce the metal salt to a reduced catalyst in a pattern corresponding to the pattern of irradiation, and plating a metal at the pattern exposing the catalyst.

U.S. Pat. Nos. 3,873,359, 3,873,360, and 3,900,614 (Lando) describe patterned metal deposition involving, according to a first embodiment, coating a substrate with a colloidal wetting solution capable of converting a catalyst precursor, such as palladium chloride, to a catalyst, using a stamp having a raised pattern to transfer to the surface the catalyst precursor so that the precursor reacts at the surface to form the catalyst in the pattern, and plating metal at the surface at the patterned catalytic region. According to a second embodiment, the method involves coating the surface with a catalyst precursor such as palladium chloride, using a stamp to transfer to the surface a reducing agent that converts the precursor to the catalyst in a pattern corresponding to the stamp pattern thereby reacting the precursor, in the patterned region, to produce the catalyst, and plating the metal at the surface in the pattern. According to a third embodiment, the method involves transferring to the surface, in a pattern, a reducing agent capable of reacting with a catalyst precursor to form a catalyst, exposing the surface to a catalyst precursor whereby a reaction occurs forming the catalyst in the pattern, and plating metal on the surface in the pattern.

Dressick et al., Chem. Mater., 5, 148–150 (1993) describe chemisorption of ligand-bearing organosilanes onto a surface, deep UV irradiation through a patterned mask to selectively remove the organosilane in the pattern, application to the surface of a Pd(II) solution to immobilize the Pd(II) species at the regions at which the ligand remains, and electroless deposition of a metal at those regions.

The above-described methods typically are relatively time-consuming and expensive in that they involve several steps including, for example, prior to plating a metal in a pattern on a surface, carrying out a chemical reaction at the surface to convert a precursor to a reactant needed in the plating reaction, and/or involve relatively expensive equipment such as photolithographic apparatus, and/or involve the consumption of chemical reactants and generation of corresponding chemical waste to an undesirable extent.

Accordingly, a general purpose of the present invention is to provide a method of conveniently, quickly, inexpensively, and reproducibly applying to a surface a chemical activating agent in a manner that renders unnecessary at least some of the above-described procedural steps, reactants, waste products, time, and expense. Another purpose of the invention is to produce a variety of metal patterns on surfaces without these complications. Another purpose of the invention is to provide a convenient method for producing a metal pattern on a nonplanar surface. Another purpose of the invention is to provide metal pathways on substrates that are conveniently and inexpensively manufactured.

SUMMARY OF THE INVENTION

The present invention provides a convenient, rapid, and relatively inexpensive technique for applying certain chemically active species to surfaces, generally reducing the number of steps and reactions needed in a particular application. According to one embodiment, a method is provided that involves applying a chemical activating agent able to effect a chemical reaction to a surface. A chemical activating agent in colloidal form is applied, essentially instantaneously, to a region of the surface having an area of at least 10 square microns. The colloidal activating agent is in a form in which it is capable of effecting a desired chemical reaction at the surface without first, in a separate step, being converted into a chemical form different from the form in which it was applied to the surface.

The present invention also provides a method of depositing a metal on a surface. The method involves transferring an activating agent capable of promoting deposition of a metal from an application surface of an applicator to a substrate surface, and depositing the metal, via a reaction involving the activating agent, at the surface.

The present invention also provides a method of depositing a metal that involves providing an applicator having a contoured surface including at least one protrusion having an outward-facing application surface defining an application pattern. An activating agent capable of promoting deposition of a metal is applied to a region of a substrate surface in a pattern corresponding to the application pattern. Then, a metal is deposited, via reaction involving the activating agent, at the region of a substrate surface to which the activating agent was applied.

The present invention also provides a method that involves applying essentially instantaneously to one region of a substrate surface an activating agent capable of promoting deposition of a metal, while leaving another region of the surface, contiguous with the first region, free of the activating agent. Then, a metal is deposited at the first region of the surface via a reaction involving the activating agent.

The present invention also provides a method that involves applying to a substrate surface a colloidal activating agent capable of promoting deposition of a metal and depositing, via a reaction involving the activating agent, the metal at the surface. The metal can be deposited in the form of a pathway delineating a pattern including at least one portion having a dimension parallel to the substrate (a lateral dimension) of less than about one mm.

Some or all of the above-noted methods of the invention can be combined according to a further method provided by the invention that involves depositing a metal on a surface. The method according to this embodiment involves providing an applicator having a contoured surface including at least one protrusion having an outward-facing application surface defining an application pattern, and applying to the at least one protrusion of the applicator a colloidal activating agent capable of promoting deposition of a metal. The colloidal activating agent then is transferred, essentially instantaneously, to a first region of a substrate surface in a pattern corresponding to the protrusion pattern by bringing the at least one protrusion into contact with the first region of the substrate surface. A second region of the surface, contiguous with the first region, remains free of the activating agent. A metal then is deposited, via a reaction involving the colloidal activating agent, at the surface in the form of a pathway delineating a pattern including at least one portion having a dimension parallel to the substrate of less than about one mm.

The present invention also provides articles formed in accordance with any of the above-noted methods, or formed independently of these methods. According to one embodiment, an article of the invention includes a substrate and a metal pathway on the substrate that delineates a pattern on a first region of the substrate. The pattern includes at least one region defining a continuous, essentially linear portion of metal deposited on the substrate via a reaction involving an activating agent promoting deposition of the metal transferred to the substrate from an applicator. The linear portion of the metal has a dimension parallel to the substrate of less than about one mm.

The embodiments of the invention described above can be carried out using an applicator that is a stamp, for example a stamp having an elastomeric application surface (e.g. an elastomeric stamp), including a stamping surface selected in conjunction with an activating agent such that the activating agent can be applied to the stamping surface, carried by the stamping surface, and transferred from the stamping surface to a region of a substrate surface. The stamp can be re-applied to the substrate surface any number of times in any number of orientations relative to the substrate surface, and/or a plurality of different stamping surfaces can be brought into contact with a substrate surface to form a pattern created by the combination of stamping surfaces.

The invention provides, according to one embodiment, metal features on a surface that have a dimension perpendicular to the surface of at least 0.2 micron, and can produce a metal in a pattern having a portion with an edge resolution on the order of at least about 100 nm.

Other advantages, novel features and objects of the invention will become apparent from the following detailed description of the invention when considered in conjunction with the accompanying drawings.

DETAILED DESCRIPTION OF THE INVENTION

Commonly-owned U.S. Patent Application Serial No. (to be assigned), filed on even date herewith by Kim, et al. and entitled "Method of Forming Articles and Patterning Surfaces Via Capillary Micromolding" is incorporated herein by reference in its entirety.

The present invention provides a strategy for applying to a surface a chemical activating agent, such as a catalyst, quickly, cleanly, and efficiently. According to one aspect, the invention involves metal plating on a substrate by direct application onto the substrate of an activating agent that promotes deposition of the metal followed by deposition of the metal on the substrate. Thus, prior art methods involving for example photolithography, or application to a surface of a precursor, chemical conversion of the precursor to a catalyst, and reaction involving the catalyst at the surface to produce the desired end product are reduced essentially to two steps by the invention: application of the activating agent to the surface, followed by reaction involving the agent at the surface to create the desired end product. Articles having patterned metal features with submicron dimensions and an edge resolution on the order of 100 nm can result. As used herein, the term "edge resolution" is meant to define that an intended linear portion of a patterned metal feature will deviate from a straight line in an amount less than or equal to about 100 nm.

Devices fabricated in accordance with the invention can be used for a variety of purposes that will be apparent to those of ordinary skill in the art, for example microelectronics, optics, antennas, and the like.

Figure 1:
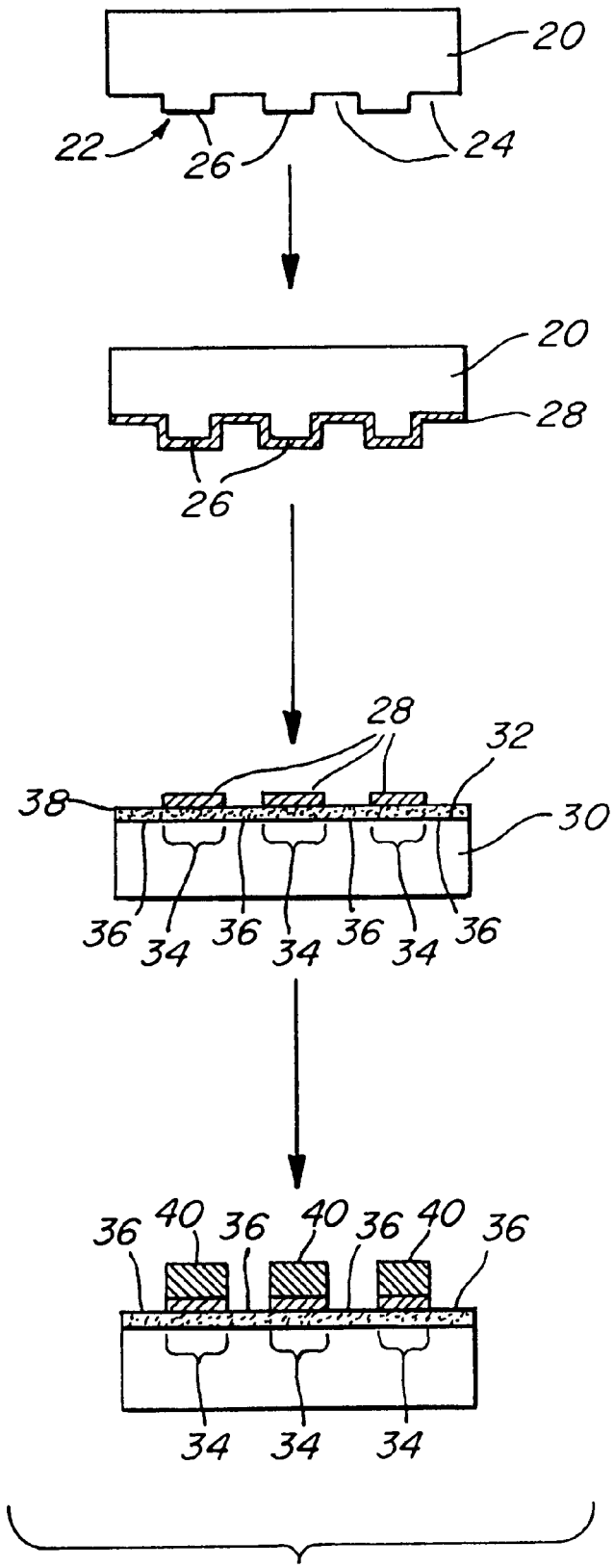
FIG. 1 illustrates schematically a process of microcontact printing of a chemical activating agent at defined regions of a substrate, followed by deposition of metal at the defined regions.

FIG. 1 is a schematic illustration of a method of depositing a metal on a substrate surface. According to the method an applicator, in particular a stamp 20, is provided having a surface 22 including indentations 24 formed therein and defining an indentation pattern, the indentations contiguous with an application surface 26 defining an application pattern. Defined another way, surface 22 includes protrusions 26, each having an outward-facing surface defining an application pattern. Although not shown, indentations 24 may be interconnected to form a single, continuous, patterned indentation and/or protrusions 26 may be interconnected to form a single, continuous, patterned protrusion. Thus, protrusions 26 may define a patterned application surface, including a plurality of application regions isolated by an intervening indentation(s), or a patterned stamping surface that is a single, continuous region contiguous with a continuous indentation or indentations.

The invention provides for deposition of metal on a substrate surface in a manner such that the metal so formed has a lateral dimension, or dimension parallel to the substrate surface (width) of less than about 1 mm. According to one aspect of the invention this is achieved by providing a stamp 20 having a protrusion, or stamping surface 26, having a lateral dimension, or dimension generally parallel to surface 22, of less than about 1 mm. Preferably, the lateral dimension of protrusion or stamping surface 26 is less than about 500 mm or 100 mm, more preferably less than about 50 mm, 20 mm, or 10 mm, most preferably less than about 5 mm or 1 mm. When these dimensions in application pattern lateral dimension are formed, patterns of chemical activating agent applied to a surface in similar dimensions can be achieved. Additionally, as described below, dimensions of an applied pattern of chemical activating agent on a surface can be achieved at a dimension different (for example, less than) the smallest dimension of the application pattern of the applicator.

According to one aspect, the invention provides for essentially instantaneous transfer, to a region of a substrate surface having an area of at least ten square microns, a chemical activating agent. The activating agent can be in collidal form. According to some embodiments, the activating agent is applied essentially instantaneously to a region of the substrate surface having an area of at least about 50 square microns, preferably, at least about 100 square microns, more preferably, at least about 200 or about 500 square microns, and most preferably, at least about 1,000 square microns. According to another aspect, the invention involves essentially instantaneous transfer of a chemical activating agent to a substrate surface in an area of less than about ten square microns, preferably less than about five square microns, more preferably less than about two square microns and most preferably, less than about one square micron. Those of ordinary skill in the art understand the advantageous nature of such controlled application.

For purposes of illustration, a preferred embodiment of an applicator including a plurality of protrusions is described and illustrated. It is to be understood, however, that any applicator that is capable of carrying a chemical activating agent and transferring the chemical activating agent to a substrate surface finds use in the invention. For example, a flat applicator to which a pattern of a chemical activating agent is applied (for example using techniques as described in the present invention or other techniques) can be used to transfer the chemical activating agent, in the pattern, to a substrate surface. Moreover, the shapes of the protrusions described and illustrated need not be of essentially rectangular cross section, but can be of any shape. In particular, protrusions having more pointed features, such as those molded in anisotropically-etched molds as described in co-pending, commonly owned U.S. application Ser. No. 08/397,635, incorporated herein by reference, may be used to form particularly fine features on a substrate surface.

FIG. 1 will be further described, for purposes of example only, in terms of a metal deposition or plating reaction using a stamp as an applicator. According to the method, an activating agent 28 that promotes deposition of a metal is applied to surface 22, notably application or stamping surface 26. Stamp 20 is placed in proximity of a substrate 30 that includes a surface 32 facing the stamp. The stamp is positioned in a first orientation, proximate surface 32, such that activating agent 28 is transferred to regions 34 of surface 32 from stamping surface 26. Second portions 36 of surface 32, contiguous with first portions 34, remain free of activating agent 28. Thus regions 34 of substrate surface 32 that correspond to the stamping pattern 26 receive the activating agent. In accordance with the description of stamping surface 26 and indentations 24 above, the pattern of activating agent 28 applied to surface 32 can be a continuous region or can be a plurality of isolated regions.

If needed, an adhesion promoter 38 can be applied to surface 32 prior to application of the activating agent 28 thereto, or activating agent 28 can be applied directly to surface 32 in the absence of adhesion promoter 38 under certain circumstances. A description of activating agents 28 and substrates 30 amenable to the process of the invention with, and without, adhesion promoter is described more fully below. It is to be understood that, when an adhesion promoter is required, it is needed only at those regions of substrate 30 at which activating agent 28 is to be applied, but can be applied to any region of the surface. When an adhesion promoter, such as a self-assembled monolayer, is used, description of the invention that involves transfer or application of a chemical activating agent to the surface, or depositing a species on a surface, is meant to include transfer or deposition on an adhesion promoter that is, in turn, on a surface.

Subsequent to the process described thus far, a variety of procedures may be followed. According to one, as illustrated in FIG. 1, a metal 40 is deposited at regions 34 of surface 30 to which activating agent 28 has been applied, via a reaction effected by the activating agent. Thus the metal is formed at surface 30 in the form of a pattern corresponding to the pattern in which activating agent 28 is applied. The metal thus can be deposited in the form of isolated regions, or in the form of a single continuous region that, according to one embodiment, is in the form of a pathway delineating a pattern. As used herein, the term "pattern" is meant to define a predetermined, planned shape that can effectively be created on a substrate surface. Such a predetermined pattern can include a plurality of isolated, non-interconnected regions such as an array or grid of dots or squares, a single region that includes linear and non-linear portions such as an electronic circuit, or a combination. While a random pattern can be generated, one advantage of the invention is that a pattern can be pre-designed and then created on a surface in accordance with the invention.

According to another embodiment of the invention, prior to deposition of metal 40, stamp surface 26 is removed from the proximity of surface 32, optionally re-coated with activating agent 28, is positioned in a second orientation different from the first stamping orientation, and is again brought into proximity of surface 32 thereby applying activating agent 28 to portions of surface 32 different from and/or in addition to those portions to which agent 28 had been applied during the original application step. The same or different activating agent can be used in the various steps. For example (not shown in FIG. 1), a pattern of activating agent 28 can first be formed on surface 32 via transfer from stamping surface 26 positioned in a first orientation, the first pattern including at least one essentially linear portion, followed by positioning of stamping surface 26 in a second orientation such that a second linear portion of activating agent 28 is formed that intersects the first essentially linear portion. Any other set of first and second orientations of stamp 20, resulting in a variety of patterns of activating agent 28 on surface 32, can be formed.

Alternatively, after transfer of activating agent 28 from stamping surface 26 to surface 32, a second stamp having a similar or different stamping pattern can be used to transfer a similar or different pattern of activating agent 28 in a similar or different orientation to surface 32 of substrate 30. Alternatively still, successive transfer of different activating agents to surface 32 from one or more applicators in similar or dissimilar orientations can take place. The same or different activating agents can be used in the various transfer steps.

Following these alternate and optional steps, metal 40 can be deposited at surface 32 at a region or regions to which activating agent 28 had been applied, forming a pattern corresponding to the pattern of activating agent 28.

Following plating of metal 40 at surface 32, stamp 20, or a different stamp, can be applied to surface 32 in an orientation the same or different from that of the orientation of the first stamping procedure to deposit an activating agent (the same as or different from the original agent) onto at least one portion of deposited metal 40, onto at least one portion of surface 32 not covered by metal 40, or both. Then, a second depositing step can be carried out in which metal is deposited at surface 32 via activating agent 28 and, in the case of autocatalytic deposition, metal 40 can plate at regions where the metal had previously been deposited.

Although a stamp is illustrated in FIG. 1 in connection with a description of the general process of the invention, the techniques of the invention can employ any applicator capable of transferring an activating agent to a substrate surface. For example, the applicator may comprise one or more generally aligned fluid outlets fluidly connected to one or more reservoirs of activating agent that, when brought into proximity of the substrate surface, could deliver to the substrate surface the activating agent. According to a preferred embodiment, the applicator is capable of applying the activating agent essentially instantaneously to the substrate surface. This generally is achieved in an applicator having application regions aligned essentially in a plane and defining an application surface. For example, an applicator having a plurality of regions, optionally isolated from each other, that together can be aligned essentially in a plane, and that together can define an application surface carrying a chemical activating agent, would be suitable for applying the activating agent essentially instantaneously to an essentially planar surface. Alternatively, if the plurality of regions that together define the application surface can be made to form a shape corresponding to the shape of a nonplanar substrate surface the applicator is suitable for applying the activating agent to the nonplanar surface essentially instantaneously.

Thus, the invention provides for an efficient method of transferring an activating agent to a surface that involves simply applying the activating agent to the surface from an applicator. Where an applicator is used having a surface that faces the substrate surface and carries the activating agent, the activating agent can be transferred essentially instantaneously, i.e. by stamping, to the substrate surface. The need to carry out a chemical reaction at the surface to convert a precursor to an activating agent is avoided.

The activating agent is selected as one capable of being carried by an applicator, transferred from the applicator to a surface in a form in which it can effect a chemical reaction (such as a metal deposition reaction), and immobilized at the surface with a degree of adhesion and for a period of time sufficient to participate in the desired chemical reaction. As such, the activating agent can be a transition metal such as palladium, a transition metal colloid, or other agent that can be so transferred. Activating agents are discussed in greater detail below. Those of ordinary skill in the art can formulate or modify a surface of an applicator that is used to transfer an activating agent to a substrate surface, and/or the substrate surface, and/or the activating agent or its carrier, so that transfer from the applicator to the substrate surface can be easily carried out.

Referring again to FIG. 1, according to one embodiment of the invention adhesion promoter 38 promotes adhesion of activating agent 28 to surface 32 of substrate 30. When use of an adhesion promoter is desirable, any adhesion promoter that increases the interaction between the activating agent 28 and surface 32 is suitable, and its selection will depend somewhat upon the characteristics of surface 32 and the characteristics of activating agent 28. When activating agent 28 is supplied in the form of a colloid as described more fully below, adhesion promoter 38 can be formed of a silane layer having a variety of terminal groups such as $CH_3$, CN, SH, $NH_2$, $NHCH_2CH_2NH_2$, etc. Adhesion also can be achieved by treatment of the substrate with a self-assembled monolayer (SAM) exposing away from the substrate surface a chemical functionality conducive to activating agent adhesion. SAM-forming species in connection with a variety of substrates, and exposing away from the substrate surface a variety of chemical functionalities, such as hydrophobic or hydrophilic functionalities, etc, are described in commonly-owned copending U.S. patent application Ser. No. 08/131, 841 to Kumar et al., incorporated herein by reference. In the case of a polymer surface, silane functionalization is a preferred method of adhesion promotion. Amine-functionalization of a surface also can promote adhesion, and surfactants also can be adhesion promoters. Oxidizing a surface also will promote adhesion to a reasonable extent and this technique, without the use of any adhesion promoter, will be suitable for preparing a surface to receive many activating agents. Many surfaces, for example a silicon wafer with a native oxide layer, exhibit good adhesion without use of an adhesion promoter.

Substrate 30 can be an electrical conductor, non-conductor, or semiconductor and can be made of glass, silicon (including a native oxide layer), a polymer, ceramic, or the like. Any substrate can be used that is capable of adhering an active agent 28 to the extent that the active agent can participate in a reaction proximate the substrate surface and, as discussed, the nature of substrate 30 and the nature of activating agent 28 will dictate to some extent the need for, and characteristics of, an adhesion promoter 38.

In embodiments in which an activating agent and substrate are employed in which an adhesion promoter is desired, as an alternative to providing a layer of adhesion promoter on the surface and then applying the activating agent to the surface, a single admixture of adhesion promoter and activating agent 28 can be applied to stamping surface 26 and the admixture applied to regions 34 of surface 32 of substrate 30, followed by plating of metal 40 at regions 34.

When applicator 20 is a stamp, the stamp can be made of any material including a stamping surface 26 that can carry activating agent 28 and transfer activating agent 28 to substrate surface 32. Accordingly, the chemical nature of stamping surface 26, activating agent 28, and/or any carrier of activating agent 28 can be together selected such that the activating agent can be effectively transferred from surface 26 to surface 32, as discussed above. Where the chemical nature desired in the stamping surface results in inconvenience or excess expense in the fabrication of the entire stamp from that material, the stamp can be fabricated from any material, and coated at stamping, or application surface 26 with a suitable material. Stamp 20 can be rigid or flexible and, according to a preferred embodiment, stamp 20 is an elastomer such as is described in U.S. patent application Ser. No. 08/131,841, referenced above, and can be formed in a variety of ways as described therein and/or as described in U.S. patent application Ser. No. 08/485,457, entitled "Microcontact Printing on Surfaces and Derivative Articles", by Whitesides et al., filed Jun. 7, 1995, and incorporated herein by reference in its entirety. In that application is described a method of forming an elastomeric stamp having a stamping surface that defines a plurality of isolated protrusions that terminate, in a direction away from the stamp, essentially in a plurality of points. Thus, very small, isolated regions of a substrate can be contacted by the stamping surface to produce a plurality of very small, isolated regions of activating agent and resulting small, isolated regions of plated metal. Alternatively, such a stamp can be used to "write" on a surface, as described in application Ser. No. 08/485,457. As used herein, the term "write" is meant to define contacting substrate surface 32 with stamping surface 26 and moving stamping surface 26 laterally relative to substrate surface 32 to apply activating species 28 to surface 32 in a pattern corresponding to movement of the stamp, and in particular application surface 26, relative to surface 32.

The dimensions of the regions 34 of substrate 32 to which activating agent 28 is applied can be altered by, as described in application Ser. No. 08/485,457, referenced above, deforming the stamp prior to and/or during transfer of the activating agent to the substrate surface. The stamp can be deformed by compression along any of its axes relative to the substrate, for example compression laterally (in a direction parallel to the substrate), and/or vertically (in a direction parallel to the substrate surface). Such deformation can increase or decrease the lateral dimensions of regions 34 to which activating agent 28 is applied.

Figure 2A:
FIGS. 2a, 2b and 2c are photocopies of scanning electron micrograph (SEM) images of micrometallic structures fabricated on substrates in accordance with the invention.
Figure 2B:
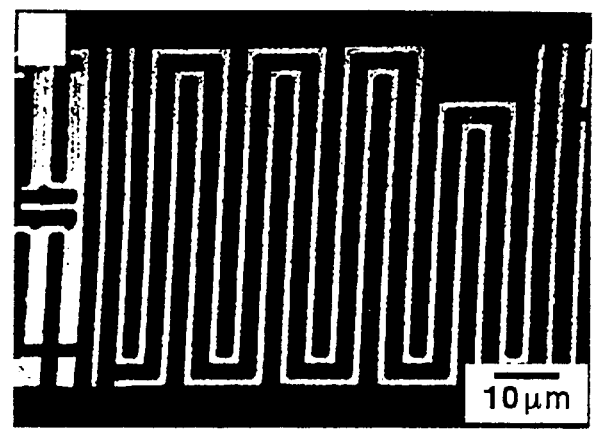
Figure 2C:

Referring now to FIG. 2a, photocopies of SEM images of typical microstructures that can be produced by the methods of the present invention are shown. FIG. 2a illustrates a series of copper features (light regions) deposited onto a glass substrate (dark background) following application of a palladium colloidal activating agent to the glass substrate using a stamp in accordance with the invention having a stamping, or application surface 26 (with reference to FIG. 1) corresponding to the pattern of deposited metal shown. Copper lines with a width, that is, a dimension parallel to the surface of the substrate, of between about 0.5 micron and 1.5 microns are shown. FIG. 2b is a photocopy of an SEM image of a polyimide substrate (dark background) similarly patterned with deposited copper (light lines) following application of a palladium colloidal activating agent to the substrate via a stamp. FIG. 2c is a photocopy of an SEM image of copper deposited on polyimide, as described above, followed by annealing with a propane flame for about 3 seconds. The fracture profile of the copper line shows edge resolution of about 100 nm. As discussed above, and shown in the figures, good edge resolution is achieved via the methods of the invention and deposition of metals at surfaces of substrates can be carried out so as to result in metal features having an essentially rectangular cross-section, with relatively sharp features. Addition of tensides to a solution from which a metal is plated can assist in formation of an essentially rectangular cross-sectional metal structure.

Figure 3:
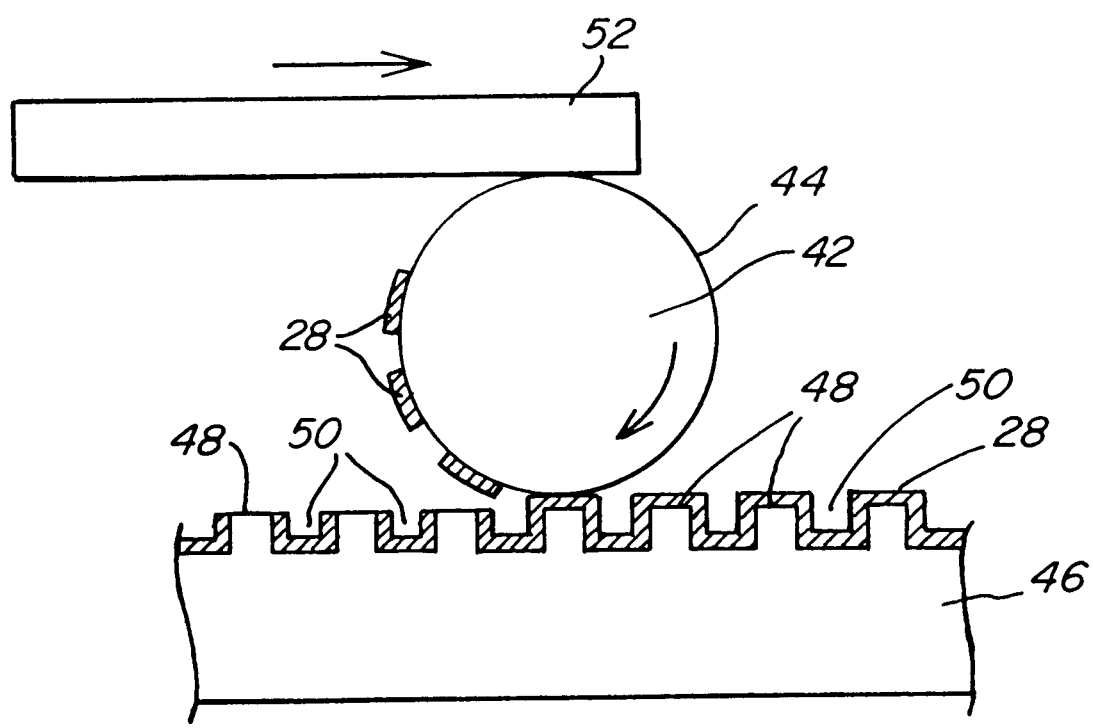
FIG. 3 illustrates schematically the application of an activating agent from an article having a patterned, contoured surface to a nonplanar surface of an article.

Referring now to FIG. 3, an article 42 that has a nonplanar surface 44 is shown during a process of transferring to nonplanar surface 44 a pattern of activating agent 28. An applicator 46 is provided that has a application surface 48 including indentations 50 that are contiguous with application surface 48. Application surface 48 thus defines a pattern that can be a continuous region including portions isolated by intervening portions of indentation(s) 50, or can be a plurality of separate regions isolated from each other by indentation(s) 50. The application surface 48 (along with indentations 50, typically) is coated with activating agent 28. Article 42 is caused to roll over application surface 48, for example by placing article 42 between stamping surface 48 and a member 52 and moving applicator 46 and member 52 relative to each other along parallel planes in opposite directions. Member 52 can be made of any material that will not disrupt or contaminate surface 44 unacceptably, and preferably a material that will not disrupt activating agent 28 formed on surface 44 to the extent that activating 28 loses its ability to facilitate deposition of metal at surface 44. As used herein, the term "roll" refers to action in which a first surface is maintained in constant contact with a second surface (for example, surface 44 of article 42 and application surface 48, respectively), but only a portion of each surface is in contact with only a portion of the other surface at any given time, and the portion of each surface that is in contact with the portion of the other surface changes continuously. In FIG. 3, article 42 is illustrated after having been rotated through approximately 80° of rotation on application surface 48. As a result, a pattern of activating agent 28 on a surface 44 of article 42 is formed around approximately 80° of the surface.

Of course, article 42 can be rolled relative to applicator 46 through any desired degree of rotation to form a pattern as desired. Following application of activating agent 28 to surface 44, a metal can be deposited at regions at which activating agent 28 is deposited.

Figure 4:
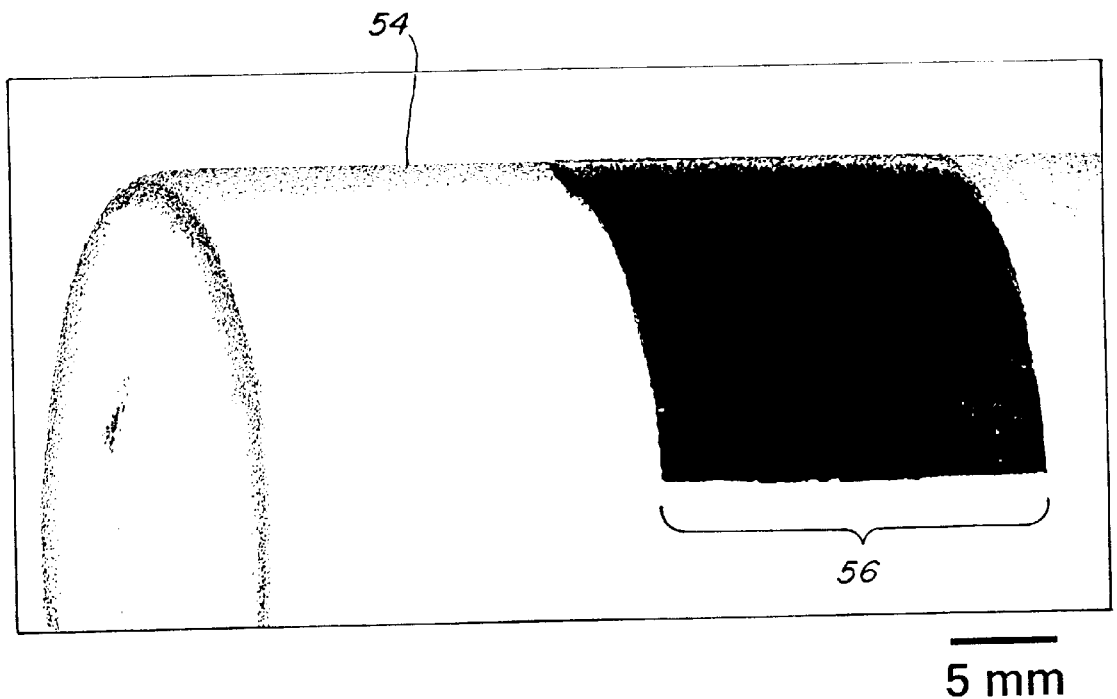
FIG. 4 is a photocopy of a photograph of a glass article having a non-planar surface including a region patterned with copper after microcontact printing of a chemical activating agent.
Figure 5:
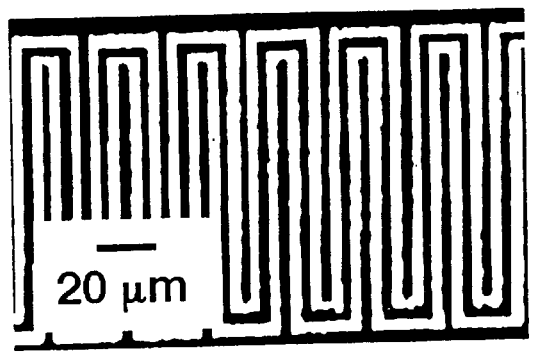
FIG. 5 is a photocopy of an optical micrograph of the copper pattern on the curved substrate of FIG. 4.

Referring now to FIG. 4, a photocopy of a photograph of a glass article 54 having a radius of curvature of approximately 1.25 centimeters is shown. A region 56 of the surface of the article was patterned with a palladium colloidal activating agent using the technique described above in connection with FIG. 3, followed by electroless deposition of copper. FIG. 5 is a photocopy of an optical micrograph of a portion of patterned region 56 of FIG. 4, showing resolution of metal features on the nonplanar substrate similar to those achieved on planar substrates as described and shown above. According to the invention, articles having a variety of radii of curvature can be patterned. A wide variety of articles including, for example, optical fibers, can be patterned in accordance with the invention. For example, patterns of chemically active agent can be printed on nonplanar articles, at the micron range, the articles having radii of curvature of less than about one centimeter, preferably less than abpit one millimeter, more preferably less than about 500 microns, more preferably less than about 100 microns, more preferably less than about 50 microns, and according to a particularly preferred embodiment printing can occur on substrates with radii of curvature on the order of about 25 microns or less.

Figure 6A:
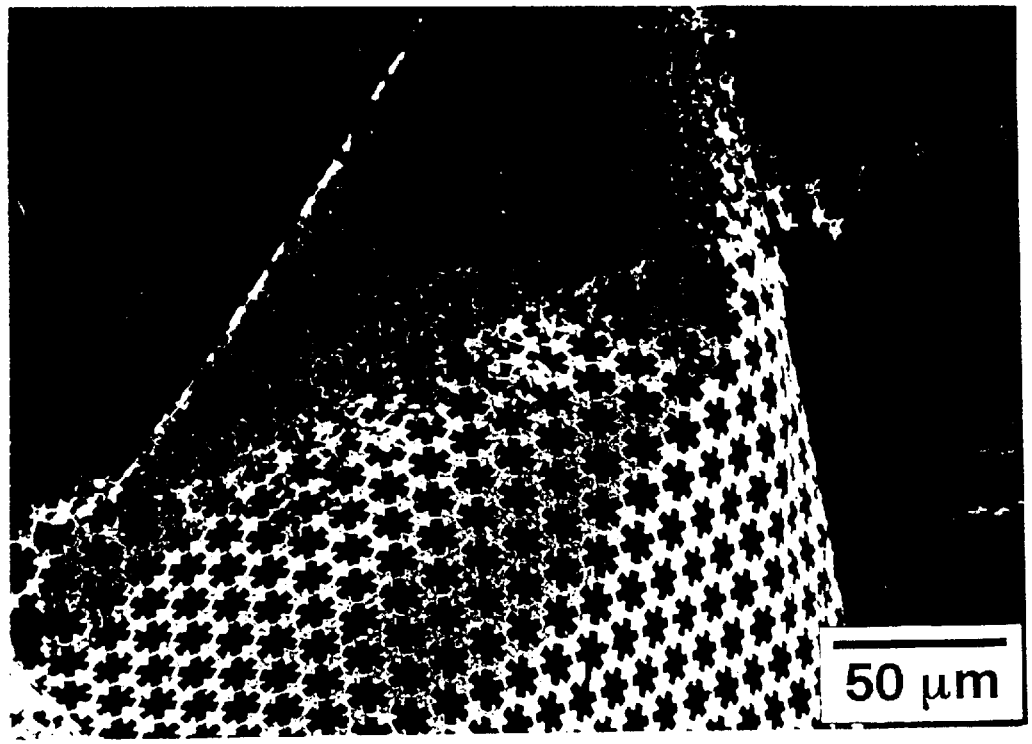
FIG. 6a is a photocopy of an SEM image of a free-standing metal microstructure removed from a substrate to which it had been deposited after application of a chemical activating agent to the substrate.
Figure 6B:
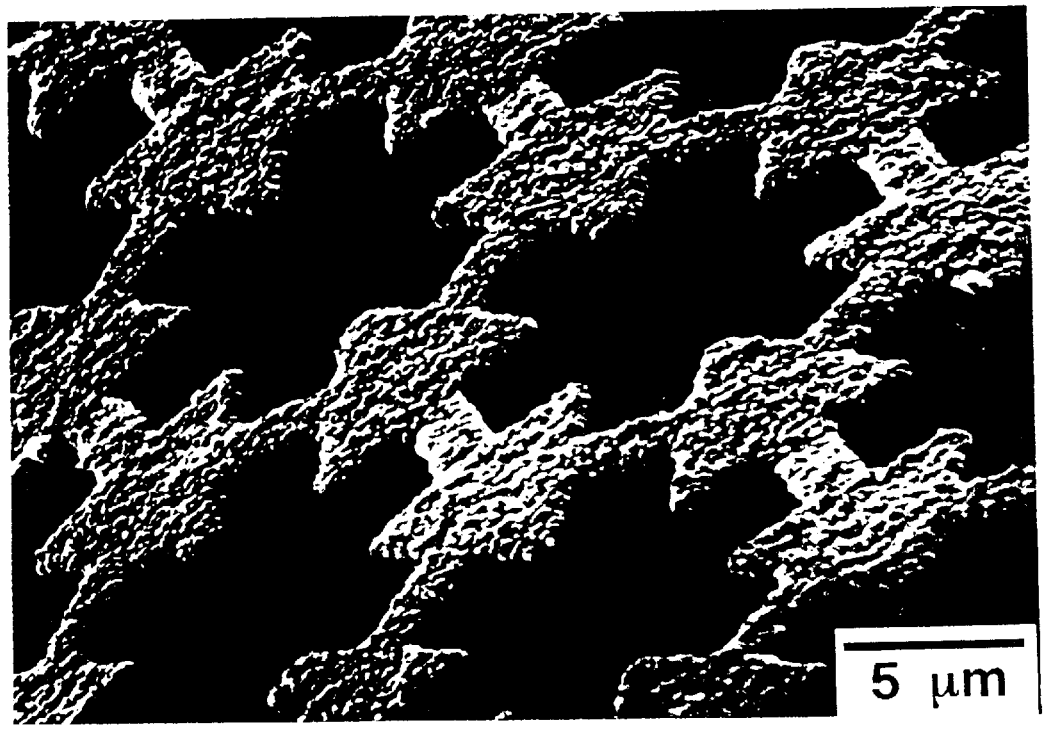
FIG. 6b is a photocopy of the structure of FIG. 6a at higher magnification.

FIG. 6a is a photocopy of an SEM image of a freestanding copper structure made by first applying to a glass substrate a palladium colloidal activating agent using a stamp having a patterned stamping surface, followed by electroless deposition of copper at regions of the surface carrying the activating agent, followed by dissolution of the glass in a dilute aqueous solution of HF. The resulting flexible, free-standing, metallic structure has a pattern corresponding to the pattern of the stamping surface of the stamp. FIG. 6b is a photocopy of the SEM image of FIG. 6a at higher resolution.

Figure 7A:
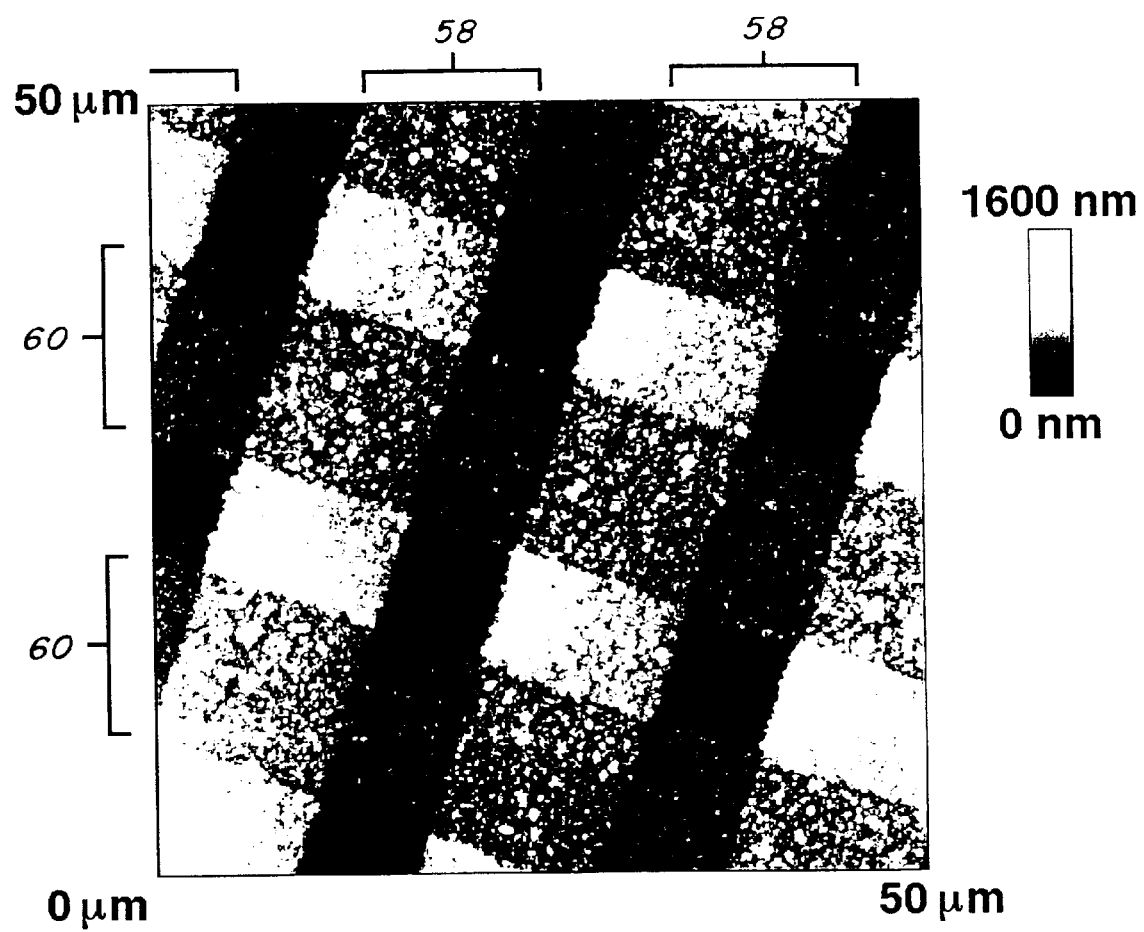
FIGS. 7a and 7b are photocopies of atomic force microscopy (AFM) images of a grid of lines of metal deposited in accordance with the present invention.
Figure 7B:
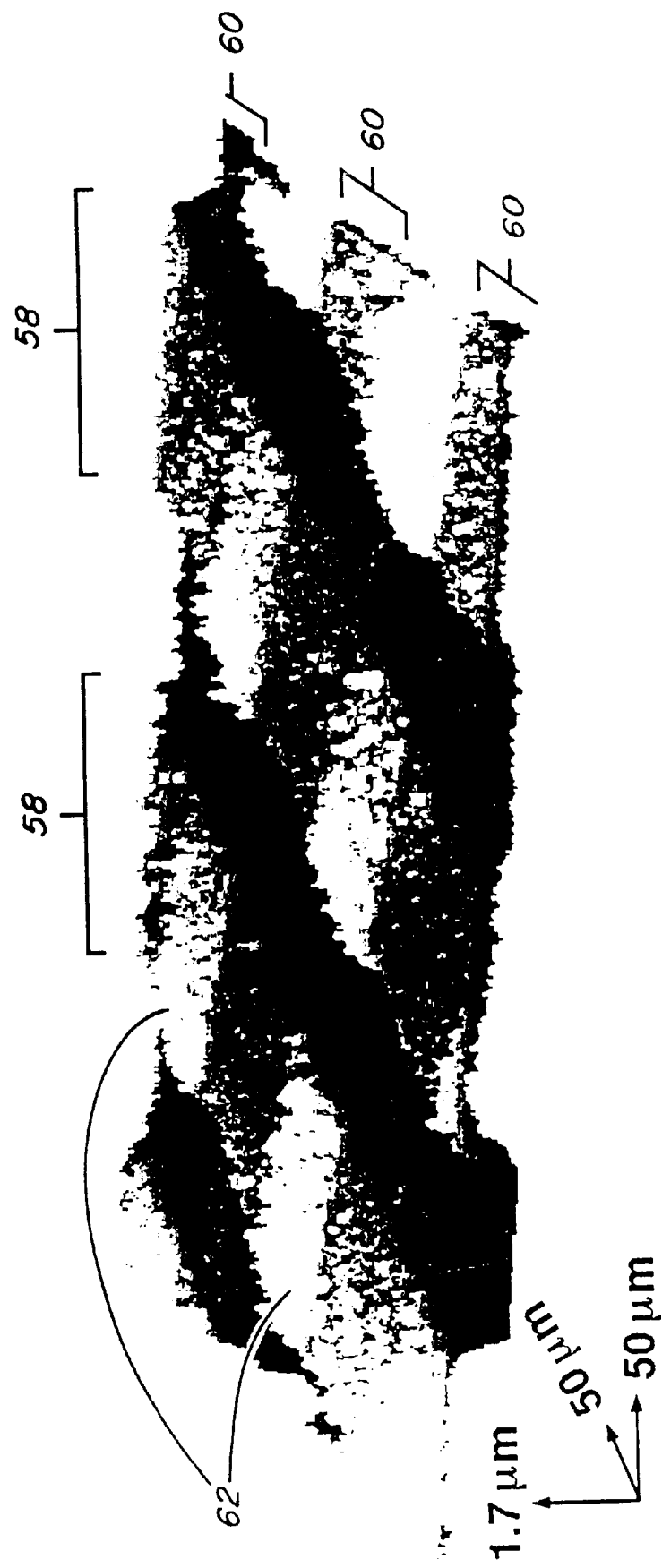

Referring now to FIGS. 7a–b, fabrication of intersecting metallic patterns and, in particular, multilevel metallic microstructures is described. FIG. 7a is a top view of an atomic force microscopy (AFM) image and FIG. 7b is a side view AFM image of a grid of 10 micron lines produced by a double stamping technique. A stamp having a stamping pattern defined by linear regions interspersed by indentations was coated with an activating agent, positioned in a first orientation and brought into contact with a substrate and removed, and the substrate subjected to metal deposition. Deposition occurred at regions 58, corresponding to regions to which the activating agent was applied. Following a period of time, the stamp was oriented above the substrate in a 90° rotation, parallel to the surface, relative to the first orientation and reapplied to the substrate. The substrate then was subjected to further metal deposition, resulting in deposition at regions 60 corresponding to the second stamping application of activating agent. Regions 62, representing regions to which activating agent was applied during the first stamping procedure but to which activating agent was not applied during the second stamping procedure show the greatest amount of metal deposition. This is because the autocatalytic nature of the deposition of copper is favored over deposition of copper initiated by the activating agent.

The activating agent is selected as one capable of being carried by an applicator, transferred from the applicator to a surface in a form in which it can effect a chemical reaction (such as a metal deposition reaction), and immobilized at the surface with a degree of adhesion and for a period of time sufficient to participate in the desired chemical reaction. As such, one class of activating agents provided in accordance with the invention are distinguished from prior art agents applied with an applicator such as a stamp, for example as disclosed by Lando (U.S. Pat. Nos. 3,873,359, 3,873,360, and 3,900,614), in that the activating agent of the present invention is in a form suitable for effecting reaction such as metal plating or catalytic action when transferred to the surface. According to preferred embodiments, further chemical reaction at the surface to convert a precursor to a suitable agent, as necessitated in the referenced prior art methods, is not required.

Metal deposition reactions contemplated include electrochemical deposition and electroless deposition, generally involving reduction of a metal cation to create the metal, facilitated in part by the lowering of the electrochemical potential involved in the deposition.

Activating agents that are finely distributed metal particles and clusters, such as conventional metal powders, including substrate-fixed metal clusters or multimetallic clusters are suitable for use as activating agents in accordance with the invention, and are well known as valuable heterogeneous and homogeneous catalysts in organic, inorganic, and electrochemistry. Exemplary activating agents include one or more metals of periodic table groups Ib, IIb, III, IV, V, VI, Vllb, VIII, lanthanides, and actinides, preferably copper and any metal more noble than copper, in particular Pd, Au, Ag, Pt, and Cu. Hydrogenation catalysts for example those effective in hydrogenating olefins or aromatics, as in the partial hydrogenation of benzene to form cyclohexene, with a substrate-fixed ruthenium activating agent or bimetallic activating agent (e.g. Ru/Sn) are contemplated. Zirconium and titanium catalysts, among others, are suitable for use in the invention that catalyze polymerization, such as polymerization of olefins such as ethylene, and these are intended to form part of the invention. Other examples of catalytic activating agents include those used in Heck reactions, e.g. in the Pd-catalyzed reaction of bromobenzene and styrene to form stilbene. Activating agents that are heterogeneous catalysts are also useful as electrocatalysts in fuel cells (in particular substrate-fixed Pt and Pt/Ru clusters). Activating agents prepared according to the invention can be homogeneous catalysts, such as those used in two phase systems (for instance $H_2O$/toluene), such as e.g. betaine-stabilized Pd clusters soluble in $H_2O$. Activating agents that are embedded in polymers can be used to prepare materials for electronic, optical and magnetic applications. Suitable embedding polymers include organic polymers, such as poly-p-phenylenevinylene, polymethyl methacrylate, polysilanes, and polystyrene, or inorganic polymers, such as zeolites, silicates, and metal oxides. The well-known solgel process can be used to incorporate metal clusters in amorphous metal oxide materials (e.g. $SiO_2$) as activating agents.

Soluble metal clusters that are activating agents can also be surface-deposited to prepare novel materials for applications in optics and electronics, e.g. Pd on HOPG (highly oriented pyrolytic graphite).

Particulate activating agents having particle sizes on the order of nanometers are preferred, for example particulate matter having particle size of less than about 100 nm, preferably less than about 50 nm, more preferably less than about 25 nm, and most preferably from about 2 to about 20 nm. The size of the particles is not critical except to the extent that where excellent edge resolution of a structure deposited in a reaction involving the particle is desired, the upper limit in size of the particle is reduced.

Especially preferred as activating agents in accordance with the invention are colloidal activating agents. As used herein, colloidal activating agent is meant to define particulate matter capable of being involved in a desired chemical reaction, such as a catalytic reaction and including plating of metal at surfaces, that is carried or surrounded by molecules that prevent agglomeration of the individual particles and that render the particulate soluble in, or at least able to be carried in, an organic or aqueous liquid. Suitable colloid-forming species and colloids are described in European patent publication no. 672765 by Reetz et al., published Sep. 20, 1995, and incorporated herein by reference. According to one embodiment the activating agent comprises one or more metals of groups Ib, IIb, III, IV, V, VI, VIIb, VIII, lanthanides, and/or actinides of the periodic table prepared by cathodic reduction in the presence of a stabilizer. One method of preparation of such colloids is reduction, optionally with a supporting electrolyte, in organic solvents or in solvent mixtures of organic solvents and/or water within a temperature range of between about $-78°$ C. and about $120°$ C. to form metal colloidal solutions or redispersible metal colloid powders, optionally in the presence of inert substrates and/or soluble metal salts of the respective metals. These colloids are soluble or redispersible in a suitable fluid that facilitates their application to an applicator such as a stamp. The following articles, incorporated herein by reference, describe as well exemplary activating agents suitable for use in connection with the invention. Vargo, et al., "Adhesive Electroless Metallization of Fluoropolymeric Substrates" *Science*, 262, 1711–1712 (Dec. 10, 1993); Bönnemann, et al., "Preparation and Catalytic Properties of $NR_4^+$ Stabilized Palladium Colloids", *Applied Organometallic Chemistry* 8, 361–378 (1994); Reetz, et al., "Size-Selective Synthesis of Nanostructured Transition Metal Clusters" *J. Am. Chem. Soc.* 116, 7401–7402 (1994); Reetz, et al., "Visualization of Surfactants on Nanostructured Palladium Clusters by a Combination of STM and High-Resolution TEM", *Science*, 267, 367–369 (Jan. 20, 1995); and Meldrum, et al., "Formation of Thin Films of Platinum, Palladium, and Mixed Platinum Palladium Nonocrystallites by the Langmuir Monolayer Technique" *Chem. Mater.*, 7, 111–116 (1995).

Electrochemical methods are described in EP 672765, referenced above, for synthesis of soluble metal colloids by operating in an inert organic, aprotic solvent, with surface-active colloid stabilizers being added as the supporting electrolyte which will both prevent plating of the metal and protect, or stabilize, small metal nuclei in the cluster stage. A metal sheet serves as the anode to be dissolved and a metal or glassy carbon electrode serves as the cathode. After dissolution at the anode, the released metal salts are reduced again at the cathode, with tetraalkylammonium salts serving as stabilizers. Standard organic solvents can be employed.

Suitable exemplary stabilizers, or carriers, for the colloids, and at the same time as the supporting electrolyte, are quaternary ammonium or phosphonium salts $R^1R^2R^3R^4N^+X^-$ and $R^1R^2R^3R^4P^+X^-$, respectively. A wide variety of combinations of $R^1$, $R^2$, $R^3$ and $R^4$ are possible. Examples include the symmetrical tetraalkylammonium salts with $R^1=R^2=R^3=R^4$=n-butyl or n-octyl, mixed tetraalkylammonium salts with $R^1=R^2=R^3$=methyl and $R^4$=cetyl, or chiral tetraalkylammonium salts having four different residues. Aryltrialkylammonium salts may also be used. Suitable counter ions include various anions, e.g. halogenides ($Cl^-$, $Br^-$, $I^-$), hexafluorophosphate ($PF_6^-$), carboxylates $R'CO_2^-$ ($R'$=alkyl, aryl), or sulfonates $R''SO_3^-$ ($R''$=alkyl, aryl). A similar variety of phosphonium salts may be used, including tetraarylphosphonium salts, such as tetraphenylphosphonium bromide. Preferably, tetrabutylammonium chloride, bromide or hexafluorophosphate, tetraoctylammonium bromide, or tributylhexadecylphosphonium bromide can be employed. As metals, any of those listed above, in particular transition metals such as Fe, Co, Ni, Pd, Pt, Ir, Rh, Cu, Ag, or Au, are suitable. Suitable solvents are aprotic organic solvents, such as tetrahydrofuran (THF), toluene, acetonitrile (ACN), or mixtures thereof. The temperature in the electrolytic cell may be in the range between $-78°$ C. and $+120°$ C., preferably 15–30° C. or room temperature.

In this way, metal colloids of various metals and metal alloys having various sizes and being stabilized by quaternary ammonium or phosphonium salts can be synthesized for use as activating agents in accordance with the invention. The size of the metal colloids is determined by varying the current density which immediately affects the reduction potential of the cathode. The higher the overvoltage, which is defined as the deviation of the reduction potential from the equilibrium potential, the smaller the maximum size of the metal nuclei in the electrolytic boundary layer. Nuclei are trapped since the surface-active agents used as supporting electrolytes form a surrounding protective shell that prevents further growth. Thus, the size of the metal colloids can be controlled. For example, soluble Pd colloids stabilized by tetraoctylammonium bromide can be prepared with selected diameters of about 2 nm, 5 nm, or 10 nm, depending on the current density applied, i.e. 3.4, 1 and 0.4 $mA/cm^2$, respectively, at the same concentration of the stabilizer.

$R_4N^+X^-$ stabilized metal colloids can be formed in accordance with this embodiment of the invention with the use of solubilized metal stock or metal salts. Some metal stock, especially in the case of metals very resistant to oxidation, cannot be dissolved anodically or only poorly so. From the redox potentials of the metals which are available to those of ordinary skill in the art (see, for example, the *Handbook of Chemistry and Physics*, CRC Press, Boca Raton, Fla., 1981).

Colloidal activating agents suitable for use in accordance with the invention can be formed also by reducing metal salts at a cathode to form stabilized clusters in the nanometer range. Preparation can be achieved using metal salts $MX_n$, where X represents halides (F, Cl, Br, I), $RCO_2^-$ (e.g. $R=CH_3$, $CF_3$, $C_2H_5$, $C_3H_7$, $C_4H_9$, $C_6H_5$ from simple carboxylic acids, from fatty acids e.g. $R=C_{17}H_{35}$), and from chiral carboxylic acids (e.g. $R=CH(CH_3)C_6H_5$), of sulfonates $RSO_3^-$ (e.g. $R=CH_3$, $CF_3$, $CH_3C_6H_4$), and of acetylacetonates. M represents according to this technique main group elements, for instance Ga, In or Tl, as well as transition metals, for instance Fe, Co, Ni, Cu, Mo, Ru, Rh, Pd, Ag, Os, Pt, or Au. The above-mentioned ammonium or phosphonium salts serve as stabilizers for the colloids. Solvents such as those mentioned above, for example THF, toluene, propylene carbonate, acetonitrile, or mixtures thereof as well as mixtures of THF and $H_2O$ or of ACN and $H_2O$, serve as solvents. Mixtures of THF and alcohols, such as methanol or ethanol, or of ACN and alcohols may also be used. The temperature in the electrolytic cell may be within the above-mentioned range. As the anode and the cathode, inert electrode materials conventionally used in electrochemistry, e.g. Pt sheets or graphite, can be used.

Whereas the metal clusters with the above-mentioned stabilizing ammonium or phosphonium salts are soluble in organic solvents, water solubility can be achieved by using ionic (cationic, anionic, zwitterionic) or nonionic stabilizers which are readily soluble in water, optionally in the presence of a supporting electrolyte, e.g. lithium chloride, lithium acetate, or tetramethylammonium acetate. Exemplary cationic stabilizers include fully or partially esterified methyltri(hydroxyethyl)ammonium or -phosphonium salts as well as compounds of the type $R^1 R^2 R^3 R^4 N^+ X^-$ or $R^1 R^2 R^3 R^4 P^+ X^-$, with e.g. $R^1 = (CH_2CH(OH)CH_2Cl)$, $R^{2-4}$=alkyl or aryl,. Anionic stabilizers include e.g. alkali metal salts of amino acid derivatives, such as e.g. sodium alkylamido-N-hydroxyethyl-glycinates or succinates. Suitable zwitterionic stabilizers include e.g. $(CH_3)_2 N^+ (C_{12}H_{25}) CH_2CH_2CH_2SO_3^-$, $(CH_3)_2 N^+ (Cl_2H_{25})(CH_2)_x CO_2^-$ (x=1–3), or cocamidopropyl betaines. Suitable non-ionic stabilizers include e.g. sugar derivatives, such as the commercially available substances of the TWEEN® group, modified cyclodextrines, polyglycosides, octanoyl-N-methylglucamide (MEGA-8), heptylglucopyranoside, poly (vinyl alcohol), and also polyoxyethylene alkyl ethers (BRIJ 35). Variation in size of the colloid can be controlled by varying the current density which immediately affects the reduction potential of the cathode. The higher the overvoltage, the smaller the particle size.

Multimetallic metal colloids can be prepared using mixtures of two or more different metal salts, or by using as electrodes a readily dissolved metal anode (sheets of e.g. Al, Ti, Sn, Ni, Cu, Pd, Ag, or Au) and an inert cathode (e.g. a platinum sheet) with addition of a metal salt $MX_n$ in a common solvent. The electrochemical process involved oxidative dissolution of the anode to form a second metal salt, and both metal salts are concurrently reduced at the cathode to form bimetallic stabilized colloids.

The water soluble colloids prepared according to the invention can be used for the preparation of stable aqueous solutions with metal contents of above 4 mmol of metal per liter. Also possible is the preparation of aqueous solutions acidified with hydrochloric or sulfuric acid such as those used in electroplating and electroforming technology, e.g. in electroless plating (See, for example, O. J. Murphy et al., "Electrochemistry in transition: From the $20^{th}$ to the $21^{st}$ century", Plenum Press, New York, 1992, page 39, incorporated herein by reference).

Activating agents suitable for use in the invention also include carrier-fixed metal clusters, in which an undoped or doped carrier is covered with a solution in $H_2O$ of a water soluble colloid, and the water is separated. Suitable carriers include, e.g., activated charcoal, metal oxides such as $TiO_2$, $SiO_2$, $Al_2O_3$, MgO, or insoluble organic polymers (for example a polyamide, such as Kevlar®). An immobilized metal cluster is thus obtained in a simple manner. Alternatively, a slurry of the carrier in an electrolyte may be formed and electrolysis performed in the presence of the carrier. The metal clusters generated are fixed in situ on the carrier.

Chemically active or biochemically active agents and species and precursors of structures, all disclosed in commonly-owned U.S. Patent Application Serial Number (to be assigned), filed on even date herewith by Kim, et al. and entitled "Method of Forming s Articles and Patterning Surfaces Via Capillary Micromodling" referenced above, are suitable for use as species transferred from an applicator to a substrate surface in accordance with the invention as described with respect to activating agents herein.

The success of the invention is due in part to control of the chemical and physical relationship between the activating agent, and/or any carrier in which it is provided, and the application surface of the applicator, and between the activating agent and/or carrier and the surface of the substrate to which the activating agent is applied, and in part to stabilization and solubilization of activating agents in suitable solvents. The exposed chemical functionality of the activating agent, that is, the chemical nature (e.g. degree of polarity, hydrophobicity, hydrophilicity, et al.) of the portion of the activating agent or stabilizer or carrier that comes into contact with its surroundings should be selected in conjunction with the chemical functionality of the application surface such that the activating agent will adhere to the application surface to an extent needed for the applicator to carry the activating agent to the substrate surface, but not to an extent that the activating agent will not be readily transferred from the application surface to the substrate surface when the applicator is brought into contact with the substrate. That is, the wetting properties of the stamp should be somewhat matched to the chemical functionality of the activating agent.

The activating agent (or stabilizer or carrier) should be selected in conjunction with the substrate such that it will adhere to the substrate to an extent necessary for it to participate in a desired chemical reaction, such as metal plating, at the surface. The selection of material for fabrication of the applicator, at least portions of the applicator defining the application surface, should be carried out with the chemical functionality of the activating agent in mind. The substrate, at least that portion which will receive the activating agent, should be similarly selected. In many instances it will be desirable to use a particular material for a substrate, and a particular activating agent, and the chemical nature of the activating agent will not be particularly suited for adhesion at the substrate, or suited for transport from the application surface to the substrate surface. In this situation, the practitioner should select a carrier or stabilizer for the activating agent, and application surface material, that will meet the described criteria for transfer from the applicator to the substrate surface. For example, where finely-divided particles that would otherwise agglomerate undesirably, such as of one or more metals, define the activating agent, an ionic, nonionic, or zwitterionic surfactant or other surface-active agent such as a fluorocarbon, perfluoropolyacrylate, silicone, siloxane such as dimethoxypolysiloxane, diol such as 2, 4, 7, 9-tetramethyl-5-decyn-4,7-diol, diol obtained by reacting ethylene oxide with acetylenic glyco, 2, 4, 7, 9-tetramethyl-5-decyne-4, 7 diol, and the like can be used to stabilize or carry the particle.

The function and advantage of these and other embodiments of the present invention will be more fully understood from the examples below. The following examples are intended to illustrate the benefits of the present invention, but do not exemplify the full scope of the invention.

EXAMPLE 1

Pretreatment of Substrates

Glass, silicon, and polystyrene substrates were selected for application of an active agent and subsequent deposition of metal in accordance with the invention.

Glass: Cover glass No. 2, Corning) were cleaned immediately before use by soaking in freshly prepared "piranha" solution (7:3 v/v mixture of concentrated $H_2SO_4$ and 30% $H_2O_2$) for at least 30 min. (Caution: "piranha" solution reacts violently with many organic materials and should be handled with extreme care). The cleaned substrates were rinsed thoroughly with deionized $H_2O$ and dried under a stream of nitrogen.

Silicon: Silicon substrates were n-type semiconductor grade silicon <100> wafers (2 inch diameter) from Silicon Sense Inc. They were immersed immediately before use in a freshly prepared "piranha" solution for 30 min. The substrates then were rinsed thoroughly with deionized H$_2$O and dried under a stream of nitrogen.

Polystyrene: Polystyrene (2 mm thick sheets, crystalline) and polyethylene (0.5 mm thick sheets; Goodfellow) were oxidized by soaking in CrO$_3$/H$_2$SO$_4$ for 1 min. The oxidized substrates were rinsed thoroughly with deionized H$_2$O and dried under a stream of nitrogen.

Polyvinylidene chloride: Polyvinylidene chloride (Saran Wrap, Dow Chemical) was treated with a low-power, radio-frequency oxygen plasma in a Harrick plasma cleaner (Model PDC-23G) for 5 min at a oxygen pressure of 30 mbar.

EXAMPLE 2
Application of Adhesion Promoter to Substrates

After the above pretreatments, the substrates were immersed in a solution of organosilanes (50 mM) in heptane, as an adhesion promoter, for 1 hour. After rinsing with heptane and drying under a stream of nitrogen, the substrates were used for the procedure described below for application of active agent followed by metal deposition. Only freshly prepared substrates were used.

EXAMPLE 3
Preparation of Active Agent

An active agent, in particular a palladium colloidal active agent was prepared. Tetraoctadecylammonium bromide-stabilized palladium colloid (Pd/[C$_{18}$H$_{37}$]$_4$N$^+$Br$^-$) was synthesized in the following manner: Palladium(II) acetate (Fluka, 4 g, 17.8 mmol) and tetraoctadecylammonium bromide (Fluka, 5 g, 4.5 mmol) were suspended in 200 mL of a 5/1 (v/v) mixture of toluene and THF at 30° C. After adding 25 mL of absolute ethanol, the mixture was refluxed at 65° C. for 12 h. The color of the solution turned to deep brown-black. To initiate the precipitation of the colloids, an excess (100 mL) of absolute ethanol was added slowly while shaking vigorously. The solution was allowed to stand for 5 h at room temperature to complete the precipitation. The slightly colored supernatant solution was decanted, and the precipitate dried under reduced pressure. A gray-black powder (2.1 g, ca. 88.7 yield based on palladium) containing ca. 79 wt % of palladium was isolated. The powder was readily resuspended in toluene. The TEM image showed spherical, well-separated palladium particles of 7 nm in diameter. A similar procedure was used to synthesize palladium colloids stabilized with tetrabutylammonium bromide (Pd/[C$_4$H$_9$]$_4$N$^+$Br$^-$), tetraoctylammonium bromide (Pd/[C$_8$H$_{17}$]$_4$N$^+$Br$^-$) and tetradodecylammonium bromide (Pd/[(C$_{12}$H$_{25}$]$_4$N$^+$Br$^-$). The solvents were THF for the synthesis of (Pd/[C$_4$H$_9$]N$^+$Br$^-$) and (Pd/[C$_8$H$_{17}$]$_4$N$^+$Br$^-$) and a 1/1 (v/v) mixture of toluene and THF for the synthesis of (Pd/[C$_{12}$H$_{25}$]$_y$N+Br$^-$).

The suspensions of colloidal palladium (Pd/[C$_{18}$H$_{37}$]$_4$N$^+$Br$^-$) were prepared by dissolution of 0.3 g of the powder in 200 mL of toluene and sonication in an ultrasound bath for 5 min. (Pd/[C$_4$H$_9$]$_4$N$^+$Br$^-$) was soluble in DMF, (Pd/[C$_8$H$_{17}$]$_4$N$^+$Br$^-$) in THF and (Pd/[C$_{12}$H$_{25}$]$_4$N$^+$Br$^-$) in toluene. The brown solutions were stable and active for months while in solution and could be handled in air.

EXAMPLE 4
Fabrication of Applicator

An applicator having a contoured surface defined by an application surface and intervening indentations was prepared. The applicator was made in the form of a polydimethyl siloxane stamp. Sylgard™ 184 silicone elastomer, parts "A" and "B" (10/1 by weight, Dow Corning) was mixed in a plastic cup; trapped air was removed under vacuum. The mixture was poured over a master as described by Kumar, et al., *Langmuir*, 10, 1498–1511 (1994). The master was held in a polystyrene petri dish and left at room temperature for approximately two hours. It was cured by heating in an oven at 60° C. for approximately two hours.

EXAMPLE 5
Application of Active Agent to Substrate

The polydimethyl siloxane stamp fabricated as described in Example 4 was "linked" with the active agent as described in Example 3 immersing the surface of the stamp including the stamping surface into the colloidal suspension for 2 s, removing it and drying it under a stream of nitrogen. This procedure was repeated two to three times. The stamp then was placed in contact with a pretreated substrate for 15 min. Each of the substrates as described in Example 1 (glass, silicon, polystyrene, polyvinylidene chloride) were stamped in this manner. When a nonplanar glass substrate was patterned, the contact time was only a few seconds, but still long enough to allow the transfer of the colloid onto the substrate (FIGS. 3–5).

EXAMPLE 6
Metal Deposition

Electroless deposition of metal at the above-described active agent-coated regions of the substrates was carried out. A copper plating bath included: solution A containing 3 g of CuSO$_4$, 14 g of sodium potassium tartrate (Rochelle salt), and 4 g of NaOH in 100 mL of distilled water, and solution B including an aqueous formaldehyde solution (37.2 wt %). Solutions A and B were mixed in a 10/1 (v/v) ratio just before the bath was used. To deposit copper, the patterned substrate was immersed into the mixture for 30 s–600 s at room temperature. The plating time to achieve a certain film thickness depended on the age of the plating bath and the type of the substrate. The plating process could be stopped by removing the sample and rinsing it with distilled water.

The articles resulting from the procedures described in the above examples included a substrate (glass, polymer, or silicon) including a copper pathway delineating a pattern on one region of the substrate, another region of the substrate remaining free of copper. The patterns included continuous, essentially linear portions of metal having dimensions parallel to the substrate, as illustrated in FIGS. 2*a–c*, 5, and 6*b*, of the dimensions described above that can be achieved in accordance with the invention, in particular less than about 1 micron in some cases.

Those skilled in the art would readily appreciate that all parameters listed herein are meant to be exemplary and actual parameters will depend upon the specific application for which the methods and apparatus of the present invention are being used. It is, therefore, to be understood that the foregoing embodiments are presented by way of example only and that, within the scope of the appended claims and equivalents thereto, the invention may be practiced otherwise than is specifically described.

What is claimed is:

1. A method of depositing a metal on a substrate surface, comprising:

providing an applicator having a contoured surface including at least one protrusion having an outward-facing application surface defining an application pattern;

applying to the at least one protrusion a catalytic colloidal activating agent of a first metal capable of promoting deposition of a second metal;

contacting a first region of a substrate surface with the at least one protrusion to transfer, essentially instantaneously, to the first region of the surface the colloidal activating agent in a pattern corresponding to the application pattern while leaving a second region of the surface, contiguous with the first region, free of the activating agent; and depositing, via a reaction involving the colloidal activating agent, the second metal at the surface in the form of a pathway delineating a pattern including at least one portion having a dimension parallel to the surface of less than about one mm.

2. A method as in claim 1, wherein the activating agent is a species comprising one or more metals selected from the group consisting of metals of periodic table groups Ib, IIb, III, IV, V, VI, Vllb, VIII, lanthanides, and actinides.

3. A method as in claim 1, wherein the surface is a surface of a non-electrically conductive substrate.

4. A method as in claim 1, wherein the surface is a surface of a semiconductive substrate.

5. A method as in claim 1, wherein the application surface is elastomeric.

6. A method as in claim 5, wherein the applicator is an elastomeric stamp that includes at least two separate protrusions defining the application pattern contiguous with an intervening indentation.

7. A method as in claim 1, wherein the applicator has at least two protrusions defining the application pattern isolated by a contiguous intervening indentation.

8. A method as in claim 1, wherein the pattern includes at least one portion having a dimension parallel to the surface of less than about 100 microns.

9. A method as in claim 1, wherein the pattern includes at least one portion having a dimensions parallel to the surface of less than about 25 microns.

10. A method as in claim 1, wherein the pattern includes at least one portion having a dimension parallel to the surface of less than about two microns.

11. A method of depositing a metal on a substrate surface, comprising:

providing an applicator having an application surface;

transferring a catalytic activating agent of a first metal capable of promoting deposition of a second metal from the application surface to a substrate surface; and depositing the second metal, via a reaction involving the activating agent, at the surface.

12. A method as in claim 11, wherein the transferring step involves transferring the activating agent from an applicator having a contoured surface including at least one protrusion having an outward-facing application surface defining an application pattern to a first region of the surface in a pattern corresponding to the application pattern while leaving a second region of the surface, contiguous with the first region, free of the activating agent.

13. A method as in claim 12, wherein the transferring step involves contacting the first region of the surface with the at least one protrusion.

14. A method as in claim 12, the depositing step comprising depositing the second metal at the surface in the form of a pathway delineating a pattern corresponding to the application pattern at the first region, the pathway having a dimension parallel to the surface of less than about one mm.

15. A method as in claim 9, wherein the application surface is elastomeric.

16. A method as in claim 15, wherein the applicator is an elastomeric stamp that includes at least two separate protrusions defining the application pattern contiguous with an intervening indentation.

17. A method as in claim 12, wherein the applicator has at least two separate protrusions defining the application pattern isolated by a contiguous intervening indentation.

18. A method as in claim 11, wherein the activating agent is in colloidal form.

19. A method as in claim 11, wherein the activating agent is a species comprising one or more metals selected from the group consisting of metals of periodic table groups Ib, IIb, III, IV, V, VI, Vllb, VIII, lanthanides, and actinides.

20. A method as in claim 11, wherein the surface is a surface of a non-electrically conductive substrate.

21. A method as in claim 11, wherein the surface is a surface of a semiconductive substrate.

22. A method as in claim 11, wherein the surface is nonplanar.

23. A method of depositing a metal on a surface, comprising:

applying to the surface a catalytic colloidal activating agent of a first metal capable of promoting deposition of a second metal; and depositing, via a reaction involving the activating agent, the second metal at the surface in the form of a pathway delineating a pattern including at least one portion having a dimension parallel to the surface of less than one mm.

24. A method as in claim 23, the method further comprising providing an applicator having a contoured surface including at least one protrusion having an outward-facing surface defining an application pattern and carrying an activating agent, the applying step comprising transferring to a first region of the surface, from the at least one protrusion, the colloidal activating agent in a pattern corresponding to the application pattern while leaving a second region of the surface, contiguous with the first region, free of the activating agent.

25. A method as in claim 24, the transferring step comprising transferring essentially instantaneously to the first region of the surface the colloidal activating agent from the at least one protrusion.

26. A method as in claim 24, the applying step comprising contacting the first region of the surface with the at least one protrusion.

27. A method as in claim 23, wherein the activating agent is a species comprising one or more metals selected from the group consisting of metals of periodic table groups Ib, IIb, III, IV, V, VI, Vllb, VIII, lanthanides, and actinides.

28. A method as in claim 27, wherein the surface is a surface of a non-electrically conductive substrate.

29. A method as in claim 23, wherein the activating agent is in colloidal form.

30. A method as in claim 23, wherein the application surface is elastomeric.

31. A method as in claim 29, wherein the applicator is an elastomeric stamp that includes at least two separate protrusions defining the application pattern contiguous with an intervening indentation.

32. A method as in claim 23, wherein the applicator has at least two protrusions defining the application pattern isolated by a contiguous intervening indentation.

33. A method as in claim 23, wherein the surface is a surface of a non-electrically conductive substrate.

34. A method as in claim 23, wherein the surface is a surface of a semiconductive substrate.

35. A method as in claim 23, wherein the surface is nonplanar.

36. A method of applying to a substrate surface a chemical activating agent able to effect a chemical reaction, comprising:

applying essentially instantaneously to a region of the surface having an area of at least 10 square microns a pattern of a catalytic chemical activating agent of a first metal in colloidal form able to effect a chemical reaction at the surface, the region being free of pretreatment that directs the pattern.

37. A method as in claim 36, the applying step comprising applying the activating agent in colloidal form to the region of the surface from an applicator having a contoured surface including at least one protrusion having an outward-facing application surface defining an application pattern.

38. A method as in claim 37, the applying step comprising applying, from the at least one protrusion, to a first region of the surface the colloidal agent in a pattern corresponding to the application pattern while leaving the second region of the surface, contiguous with the first region, free of the activating agent.

39. A method as in claim 38, the applying step comprising contacting the first region of the surface with the at least one protrusion.

40. A method as in claim 36, the applying step comprising applying essentially instantaneously to a first region of the surface the activating agent while leaving a second region of the surface, contiguous with the first region, free of the activating agent.

41. A method as in claim 35, the method further comprising depositing, via a reaction involving the activating agent, a second metal at the surface.

42. A method as in claim 41, the depositing step comprising depositing the second metal at the surface in the form of a pathway delineating a pattern including at least one portion having a dimension parallel to the surface of less than about one micron.

43. A method as in claim 36, further comprising effecting a reaction at the surface catalyzed by the activating agent.

44. A method as in claim 43, comprising effecting the reaction involving the activating agent as a homogeneous catalyst.

45. A method as in claim 43, comprising effecting the reaction involving the activating agent as a heterogeneous catalyst.

46. A method as in claim 36, wherein the surface is a surface of a semiconductive substrate.

47. A method of depositing a metal on a substrate surface, comprising:
providing an applicator having a contoured surface including at least one protrusion having an outward-facing application surface defining an application pattern;
applying to a region of a substrate surface, in a pattern corresponding to the application pattern, a catalytic activating agent of a first metal capable of promoting deposition of a second metal; and
depositing the second metal, via a reaction involving the activating agent, at the first region of the surface.

48. A method as in claim 47, the applying step comprising transferring the activating agent from the at least one protrusion of the applicator to the region of the surface in a pattern corresponding to the protrusion pattern while leaving a second region of the surface, contiguous with the first region, free of the activating agent.

49. A method as in claim 47, the depositing step comprising depositing the second metal at the surface in the form of a pathway delineating a pattern including at least one portion having a dimension parallel to the surface of less than about one mm.

50. A method as in claim 47, wherein the activating agent is a species comprising one or more metals selected from the group consisting of metals of periodic table groups Ib, IIb, III, IV, V, VI, Vllb, VIII, lanthanides, and actinides.

51. A method as in claim 47, wherein the activating agent is in colloidal form.

52. A method as in claim 47, wherein the application surface is elastomeric.

53. A method as in claim 52, wherein the applicator is an elastomeric stamp that includes at least two separate protrusions defining the application pattern contiguous with an intervening indentation.

54. A method as in claim 47, wherein the applicator has at least two protrusions defining the application pattern isolated by a contiguous intervening indentation.

55. A method as in claim 47, wherein the surface is a surface of a non-electrically conductive substrate.

56. A method as in claim 47, wherein the surface is a surface of a semiconductive substrate.

57. A method as in claim 47, wherein the surface is nonplanar.

58. A method of depositing a metal on a surface, comprising:
applying essentially instantaneously to a first region of a surface a pattern of a catalytic activating agent of a first metal capable of promoting deposition of a second metal while leaving a second region of the surface, contiguous with the first region, free of the activating agent, the first and second regions being free of pretreatment that directs the pattern; and
depositing the metal, via a reaction involving the activating agent, at the first region of the surface.

59. A method as in claim 58, wherein the applying step comprises transferring to the first region of the surface the activating agent from an application surface of an applicator having a contoured surface including at least one protrusion having an outward-facing surface defining an application pattern.

60. A method as in claim 58, wherein the activating agent is a species comprising one or more metals selected from the group consisting of metals of periodic table groups Ib, IIb, III, IV, V, VI, Vllb, VIII, lanthanides, and actinides.

61. A method as in claim 58, wherein the activating agent is in colloidal form.

62. A method as in claim 58, wherein the application surface is elastomeric.

63. A method as in claim 62, wherein the applicator is an elastomeric stamp that includes at least two separate protrusions defining the application pattern contiguous with an intervening indentation.

64. A method as in claim 58, wherein the applicator has at least two protrusions defining the application pattern isolated by a contiguous intervening indentation.

65. A method as in claim 58, wherein the surface is a surface of a non-electrically conductive substrate.

66. A method as in claim 58, wherein the surface is a surface of a semiconductive substrate.

67. An article comprising a surface and a metal pathway on the surface delineating a pattern on a first region of the surface, the pattern including at least one region defining a continuous essentially linear portion of a second metal deposited on the surface via reaction involving a catalytic activating agent of a first metal promoting deposition of the second metal transferred to the surface from an applicator, the linear portion of the second metal having a dimension parallel to the surface of less than about 1 mm.

68. An article as in claim 67, wherein the surface is nonplanar.

* * * * *